(12) United States Patent
Krishnamurthy et al.

(10) Patent No.: US 11,605,744 B2
(45) Date of Patent: Mar. 14, 2023

(54) CORE-SHELL LAYER FOR ROOM TEMPERATURE INFRARED SENSING

(71) Applicants: Srinivasan Krishnamurthy, Cupertino, CA (US); Paul Boieriu, Lake Zurich, IL (US)

(72) Inventors: Srinivasan Krishnamurthy, Cupertino, CA (US); Paul Boieriu, Lake Zurich, IL (US)

(73) Assignee: Sivananthan Laboratories, Inc., Bolingbrook, IL (US)

( * ) Notice: Subject to any disclaimer, the term of this patent is extended or adjusted under 35 U.S.C. 154(b) by 0 days.

(21) Appl. No.: 16/889,410

(22) Filed: Jun. 1, 2020

(65) Prior Publication Data

US 2021/0376172 A1    Dec. 2, 2021

(51) Int. Cl.
*H01L 31/0232*   (2014.01)
*H01L 27/146*    (2006.01)
*C09K 11/89*     (2006.01)
*B82Y 20/00*     (2011.01)
*B82Y 15/00*     (2011.01)

(52) U.S. Cl.
CPC ...... *H01L 31/02322* (2013.01); *C09K 11/892* (2013.01); *H01L 27/14625* (2013.01); *H01L 27/14649* (2013.01); *B82Y 15/00* (2013.01); *B82Y 20/00* (2013.01)

(58) Field of Classification Search
CPC ......... H01L 31/02322; H01L 27/14625; H01L 27/14649; C09K 11/892; B82Y 15/00; B82Y 20/00
See application file for complete search history.

(56) References Cited

U.S. PATENT DOCUMENTS

| 6,995,371 | B2 | 2/2006 | Garber et al. |
| 2004/0227694 | A1* | 11/2004 | Sun ........................ G09G 3/025 |
| | | | 348/E13.055 |
| 2004/0253759 | A1* | 12/2004 | Garber .............. H01L 31/02162 |
| | | | 438/46 |
| 2010/0062194 | A1* | 3/2010 | Sun ...................... B42D 25/387 |
| | | | 428/29 |
| 2014/0027673 | A1 | 1/2014 | Nick et al. |
| 2015/0049491 | A1 | 2/2015 | Venkataraman et al. |
| 2019/0378959 | A1 | 12/2019 | Won et al. |
| 2020/0335670 | A1* | 10/2020 | Heiden .............. C09K 11/0883 |

OTHER PUBLICATIONS

Chiu Multi-Spectral QWIP-LED Devices: A Feasibility Sturdy, Defence Research Establishment Ottawa, Canada National Defencce, Oct. 1999, p. 1-38. (Year: 1999).*

(Continued)

*Primary Examiner* — David P Porta
*Assistant Examiner* — Mamadou Faye
(74) *Attorney, Agent, or Firm* — Erickson Law Group, PC

(57) ABSTRACT

An infrared up-conversion device for converting LWIR radiation to NIR radiation includes a distribution of core-shell nano-sized particles within a transparent binder material. The core-shell particles can be composed of a HgTe core and a CdTe shell. The up-conversion device can be used with a NIR imager to function as an LWIR imager without the need for cryogenic cooling.

13 Claims, 3 Drawing Sheets

(56) References Cited

OTHER PUBLICATIONS

Kipper et al. The roadmap for low price-high performance IR detector based on LWIR to NIR light up-conversion approach, Sirica Corporation and D.C. Sirica, Bar Yehuda 53, Nesher, Israel, SPIE, 2009, p. 1-6. (Year: 2009).*

Valery Garber, Nimrod Shuall, Alexander Fayer, and Emanuel Baskin, A New Approach for Quantum Infrared Detection at Room Temperature,Isreal Proceedings of SPIE—The International Society for Optical Engineering 6206—May 2006.

\* cited by examiner

CORE-SHELL LAYER FOR ROOM TEMPERATURE INFRARED SENSING

BACKGROUND

Current long wave infrared (LWIR) sensors require cooling to liquid nitrogen temperatures for high performance.

Photon IR detectors generate output signal that is proportional to the number of photons absorbed in the device material. The energy of each photon must be high enough to cause de-localizations of carriers across the device structure. The device conductivity is increased, or a potential difference is generated across a junction. These detectors are characterized by selective energy-dependent response. For mid-wave infrared (MWIR) and LWIR detectors, cryogenic cooling is required in order to reduce thermal noise by preventing thermal generation of free carriers that would compete with the optically generated carriers.

An alternate proposal for infrared detectors that does not require cryogenic cooing is to provide an operating mechanism based on the up-conversion of photon energy, i.e., conversion of low energy IR photons to high-energy visible or NIR light, that can be detected by standard Si CCD/CMOS image sensors. An external pumping light source is used to provide the additional energy required for up-conversion. Such conversion occurs in a proprietary Si-based composite structure with optically tunable properties.

U.S. Pat. No. 6,995,371 describes an IR-to-visible light imaging system using an up-conversion of photon energy. This patent describes an up-conversion layer comprising a steady-state non-equilibrium distribution (SNED) of free carriers in a composite structure of mesoscopic regions embedded within a wide-bandgap material. The SNED of free carriers has an energetic barrier provided with a composite structure. The height of this energetic barrier depends on a difference between electron affinities of the composite structure's constituent components in the number of surface states on boundaries between these components.

The patent describes a method by which a photo-induced, SNED of free carriers is achieved using mesoscopic classical confinement. A pumping light source provides the energy required to accomplish up-conversion. A light converter provides a tunable spectral responsivity to incoming IR radiation that is adjustable in relation to the photon energy of the pumping light source and the given height of an energetic barrier between the mesoscopic-sized regions and a surrounding wide-bandgap material within the composite structure. The patent discloses mesoscopic-sized silica or other narrow band-gap semiconductor material embedded within a matrix of wideband-gap semiconductor or dielectric materials. The patent discloses the term "mesoscopic" refers to particles with a mean diameter size greater than 10 nm but less than 1 micron. U.S. Pat. No. 6,995,371 is herein incorporated by reference to the extent that it is not contrary to the present disclosure.

Other relevant patent documents include US 2015/0049491; US 2014/0027673 and US2019/0378959, all herein incorporated by reference to the extent that they are not contrary to the present disclosure.

The present inventor has recognized that it would be desirable to provide an improved LWIR-to-NIR up-conversion device that obviated the need to provide cryogenic cooling.

SUMMARY

An exemplary embodiment of the invention provides an LWIR-to-NIR up-conversion device that can be used in near infrared (NIR) imagers to provide an effective long wave infrared (LWIR) sensor for food and agricultural quality control, atmospheric chemistry, combustion research, astronomy and other applications.

The exemplary embodiment of the invention can provide an effective long wave infrared (LWIR) sensor without the need for cryogenic cooling.

An infrared up-conversion device according to an exemplary embodiment of the invention includes a distribution of core-shell nano-sized particles within a transparent binder material. The core-shell particles can be composed of a HgTe core and a CdTe shell. The core can have a 2-3 nm diameter and the shell can have a 2-3 nm thickness.

An IR imager according to an exemplary embodiment of the invention includes an infrared up-conversion device coupled to the near infrared imager, wherein the infrared conversion device comprises a distribution of core-shell nano-sized particles within a transparent binder material. In the IR imager, the core-shell particles can be composed of a HgTe core and a CdTe shell. The core can have a 2-3 nm diameter and the shell can have a 2-3 nm thickness.

The HgTe core can have a bandgap of 1.3 eV (or 954 nm) due to quantum confinement and the CdTe shell can have a bulk bandgap of 1.5 eV (or 827 nm). The transparent binder can comprise a polymer with a bandgap larger than 1.5 eV.

The proposed invention alleviates the cryogenic cooling requirements of prior detectors.

DETAILED DESCRIPTION

Figure 1:
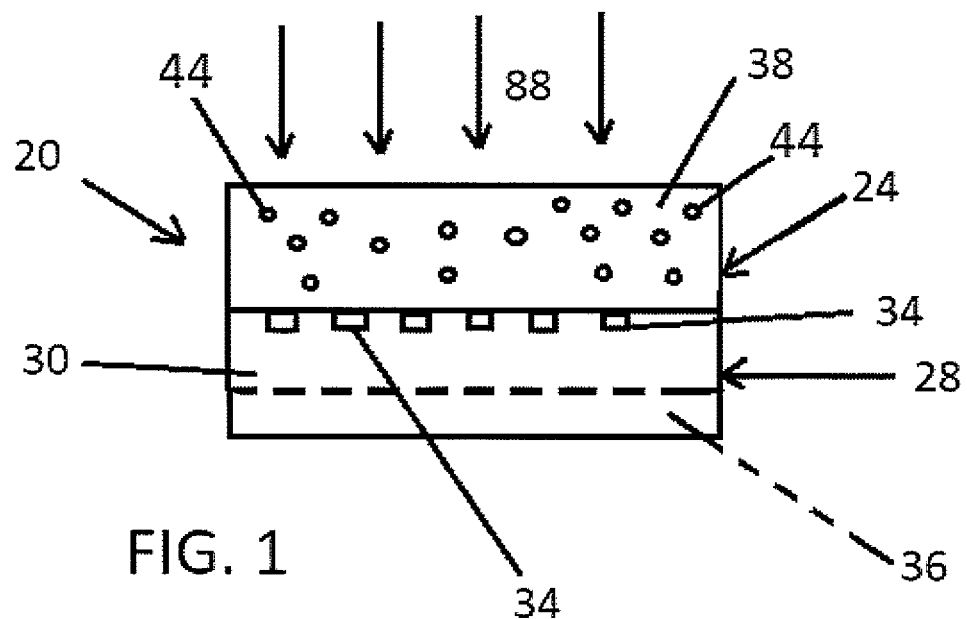
FIG. 1 is a schematic cross-section of a focal plane array incorporating an exemplary embodiment of the invention.

While this invention is susceptible of embodiment in many different forms, there are shown in the drawings, and will be described herein in detail, specific embodiments thereof with the understanding that the present disclosure is to be considered as an exemplification of the principles of the invention and is not intended to limit the invention to the specific embodiments illustrated.

FIG. 1 is a schematic cross-section of a focal plane array incorporating an exemplary embodiment of the invention. Illustrated is a stack of layers forming an MIR imaging device 20. The device 20 includes an up-conversion layer 24 coupled to, such as by overlaying on, a NIR imager 28. The up-conversion layer 24 converts LWIR radiation to NIR radiation. The NIR imager 28 includes a semiconductor substrate 30 having NIR imaging elements 34 and a read out integrated circuit (ROIC) 36. ROIC structures are described in U.S. Pat. Nos. 6,657,194 and 5,581,084, herein incorporated by reference to the extent they are not contrary to the present disclosure.

The up-conversion layer 24 includes a transparent binder 38 having core-shell nanoparticles 44 dispersed and embedded therein.

Figure 2:
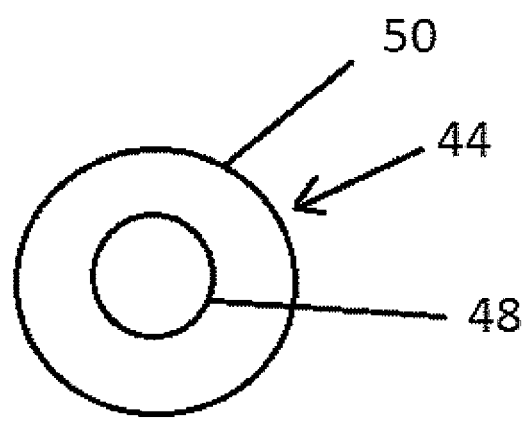
FIG. 2 is a schematic sectional view of a nano particle taken from FIG. 1.

FIG. 2 is a schematic sectional view of a nanoparticle 44 taken from FIG. 1. The particles 44 each comprise a core-shell structure. Each particle 44 can be composed of a spherical core 48 surrounded by a spherical shell 50. The core can be composed of HgTe and the shell can be composed of CdTe. The diameter of the core can be 2-3 nm HgTe with a bandgap of 1.3 eV (or 954 nm) due to quantum confinement and the shell made of 2-3 nm layer thick CdTe with a bulk bandgap of 1.5 eV (or 827 nm). The transparent binder 38 can comprise a polymer with a bandgap larger than 1.5 eV.

Figure 3:
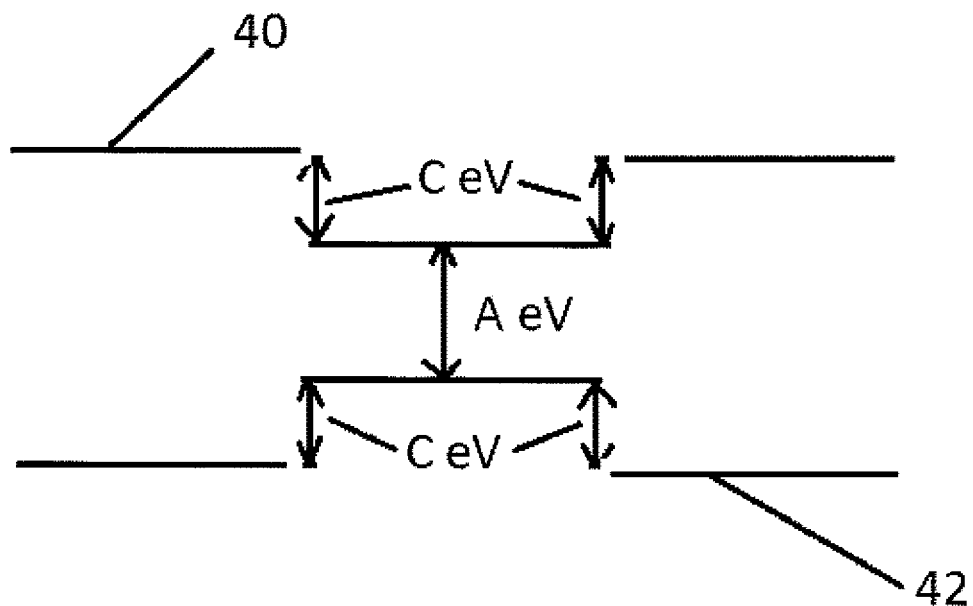
FIG. 3 is a schematic diagram of a bandgap of the core and shell.

FIG. 3 is a schematic diagram of the bandgap the core and shell. The core can have a bandgap A eV wherein A can be 1.3, and the shell can have a bandgap of B eV, wherein B can be 1.5. The conduction band 40 and valence band 42 of the core and shell are offset by C eV, wherein C can be 0.1.

Figure 4:
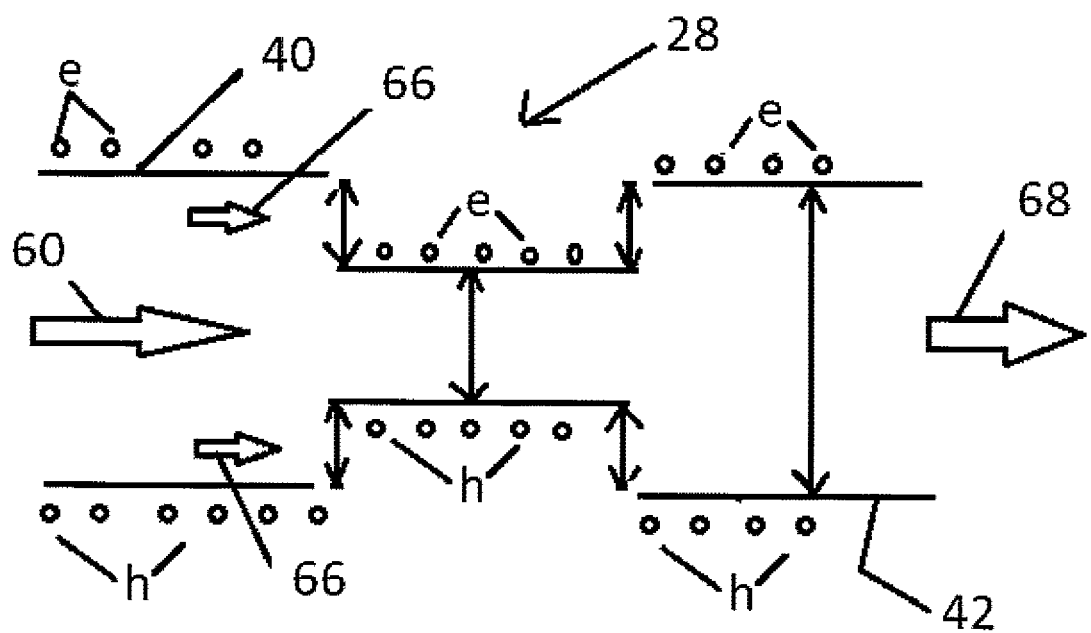
FIG. 4 is a schematic diagram of an up-conversion system according to the exemplary embodiment of the invention.

FIG. 4 is a schematic diagram of an up-conversion system according to the exemplary embodiment of the invention. A pump 60 with photon wavelength of 954 nm creates electron-hole pairs in the core 48 which are then moved to the shell 50 by a long wave infrared (LWIR) radiation signal 66. These e-h pairs in shell 50 recombine to emit a shorter wavelength (827 nm) radiation output 68 which will be used in the near infrared imager 28 at room temperature.

Figure 5:
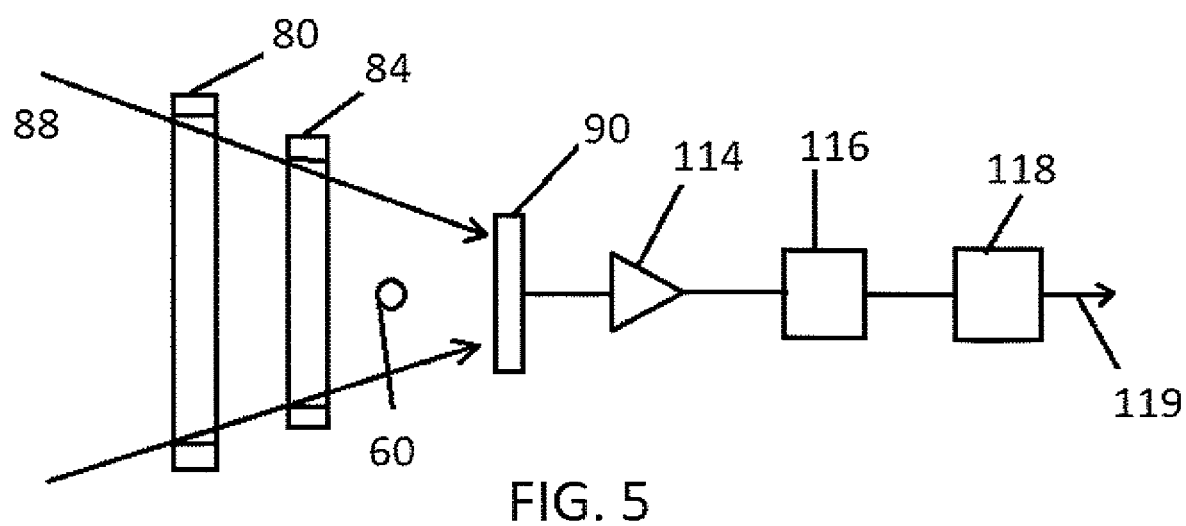
FIG. 5 is a schematic diagram of a system incorporating the exemplary embodiment of the invention.

FIG. 5 is a schematic diagram of a system incorporating the exemplary embodiment of the invention. A conventional optics subsystem 80 and iris 84 gather and focus LWIR radiation 88 from a selected field-of-view. The IR radiation may be passed through a wavelength selective filter (not shown) before impacting a focal plane array (FPA) 90, configured according to FIG. 1. The pump 60, being an optical pumping source, provides optical pumping energy to FPA 90. The IR radiation impacting FPA 90 is converted (and optionally amplified) from LWIR wavelengths to NIR wavelengths by the up-conversion layer 24 using the optical energy provided by pump 60. The resulting NIR emissions are imaged using the ROIC 36. The ROIC 36 can be a conventional CMOS imaging circuit, a charge coupled device (CCD) imager, a two-dimensional array of silicon photodiodes or photo-conductors, or a silicon readout chip.

NIR image signals from FPA 90 are subsequently passed to amplifier(s) 114, analog-to-digital converter(s) 116, and a digital processor 118. A conventional RS video signal, for example, may be readily derived as an output signal from this IR imaging system. As needed, a conventional array address generator and array bias circuit (not shown) may be incorporated within the IR imaging system of FIG. 5.

From the foregoing, it will be observed that numerous variations and modifications may be utilized without departing from the spirit and scope of the invention. It is to be understood that no limitation with respect to the specific apparatus illustrated herein is intended or should be inferred.

The invention claimed is:

1. An infrared up-conversion device for receiving a long-wave infrared radiation (LWIR) signal and converting the LWIR signal into a near infrared radiation (NIR) signal, comprising:
   a distribution of core-shell nanoparticles dispersed within a transparent binder material, each nanoparticle having a core and a shell; and
   a pump selected to have a photon wavelength to create electron-hole pairs in the core which electron-hole pairs are then moved to the shell by a long infrared radiation signal and are recombined to emit an NIR signal.

2. The device according to claim 1, wherein each of the core-shell nanoparticles is composed of a HgTe core and a CdTe shell.

3. The device according to claim 2, wherein the core has a 2-3 nm diameter and the shell has a 2-3 nm thickness.

4. The device according to claim 1, wherein the core has a 2-3 nm diameter and the shell has a 2-3 nm thickness.

5. An IR imager for receiving a long-wave infrared radiation (LWIR) signal and converting the LWIR signal into a near infrared radiation (NIR) signal and imaging the NIR signal, comprising:
   an infrared up-conversion device; and
   a near infrared imager coupled to the infrared up-conversion device; and
   the infrared up-conversion device comprising a distribution of core-shell nanoparticles within a transparent binder material, each nanoparticle having a core and a shell; and
   wherein the infrared up-conversion device comprises a pump selected to have a photon wavelength to create electron-hole pairs in the core which electron-hole pairs are then moved to the shell by an LWIR signal and are recombined to emit an NIR signal to the near infrared imager.

6. The IR imager according to claim 5, wherein each of the core-shell nanoparticles is composed of a HgTe core and a CdTe shell.

7. The IR imager according to claim 6, wherein the core has a 2-3 nm diameter and the shell has a 2-3 nm thickness.

8. The IR imager according to claim 5, wherein the core has a 2-3 nm diameter and the shell has a 2-3 nm thickness.

9. The IR imager according to claim 5, wherein the selected wavelength is about 954 nm.

10. The IR imager according to claim 5, wherein the near infrared signal has a wavelength of about 827 nm.

11. The IR imager according to claim 5, wherein the near infrared imager comprises a semiconductor substrate having NIR imaging elements and a read out integrated circuit (ROIC).

12. The infrared up-conversion device according to claim 1, wherein the selected wavelength is about 954 nm.

13. The infrared up-conversion device according to claim 1, wherein the signal of a shorter wavelength has a wavelength of about 827 nm.

* * * * *